(12) United States Patent
Yu et al.

(10) Patent No.: US 12,489,092 B2
(45) Date of Patent: Dec. 2, 2025

(54) APPARATUS AND METHOD OF MANUFACTURING DISPLAY USING LIGHT EMITTING ELEMENT

(71) Applicant: LG ELECTRONICS INC., Seoul (KR)

(72) Inventors: Jemin Yu, Seoul (KR); Sungyun Park, Seoul (KR); Hyunho Lee, Seoul (KR); Kiseong Jeon, Seoul (KR); Soohyun Kim, Seoul (KR); Inbum Yang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 577 days.

(21) Appl. No.: 17/789,049

(22) PCT Filed: Jan. 3, 2020

(86) PCT No.: PCT/KR2020/000138
§ 371 (c)(1),
(2) Date: Jun. 24, 2022

(87) PCT Pub. No.: WO2021/132789
PCT Pub. Date: Jul. 1, 2021

(65) Prior Publication Data
US 2023/0048122 A1 Feb. 16, 2023

(30) Foreign Application Priority Data
Dec. 26, 2019 (KR) .................. 10-2019-0175386

(51) Int. Cl.
*H01L 33/62* (2010.01)
*H01L 21/683* (2006.01)
(Continued)

(52) U.S. Cl.
CPC ...... *H01L 25/0753* (2013.01); *H01L 21/6835* (2013.01); *H10H 20/857* (2025.01);
(Continued)

(58) Field of Classification Search
CPC ............... H01L 24/89; H01L 21/67144; H01L 21/67709; H01L 21/67721;
(Continued)

(56) References Cited

U.S. PATENT DOCUMENTS

2011/0171397 A1 7/2011 Lee et al.
2014/0183269 A1 7/2014 Glaser
(Continued)

FOREIGN PATENT DOCUMENTS

CN 101090995 A 12/2007
CN 110265341 A 9/2019
(Continued)

*Primary Examiner* — Jay C Kim
*Assistant Examiner* — Joshua Scott Wyatt
(74) *Attorney, Agent, or Firm* — Birch, Stewart, Kolasch & Birch, LLP

(57) ABSTRACT

Discussed is an apparatus and a method of manufacturing a display using a micro light emitting diode (LED). A method of manufacturing a display device using a light emitting element includes providing a substrate having an individual pixel position defined by a pair of assembly electrodes; moving the light emitting element including a magnetic body on to the substrate using a magnetic chuck having an electromagnet; assembling the light emitting element at the individual pixel position using the magnetic chuck; and recovering a remaining light emitting element which is not assembled at the individual pixel position using the magnetic chuck.

10 Claims, 20 Drawing Sheets

(51) Int. Cl.
  *H01L 25/075* (2006.01)
  *H10H 20/857* (2025.01)
  *H10H 20/01* (2025.01)
(52) U.S. Cl.
  CPC ............ *H01L 2221/68354* (2013.01); *H01L 2221/68363* (2013.01); *H10H 20/0364* (2025.01)
(58) Field of Classification Search
  CPC ....... H01L 2221/68354; H01L 25/0753; H01L 21/6773; H01L 21/6835; H01L 2221/68363; H01L 2224/95101; H10H 20/01; H10H 20/0364; H10H 20/857
  See application file for complete search history.

(56) References Cited

U.S. PATENT DOCUMENTS

2016/0211415 A1    7/2016   Huang et al.
2019/0325790 A1   10/2019   Park et al.

FOREIGN PATENT DOCUMENTS

| | | |
|---|---|---|
| CN | 110268804 A | 9/2019 |
| EP | 3 731 274 A1 | 10/2020 |
| JP | 2003-248436 A | 9/2003 |
| JP | 2005-331899 A | 12/2005 |
| JP | 2006-140398 A | 6/2006 |
| JP | 2010-106359 A | 5/2010 |
| KR | 10-2011-0082834 A | 7/2011 |
| KR | 10-2013-0033450 A | 4/2013 |
| KR | 10-1793542 B1 | 11/2017 |
| KR | 10-2018-0044465 A | 5/2018 |
| KR | 10-2019-0092330 A | 8/2019 |
| KR | 10-2019-0097946 A | 8/2019 |
| KR | 10-2019-0099149 A | 8/2019 |
| KR | 10-2019-0099164 A | 8/2019 |
| KR | 10-2019-0122117 A | 10/2019 |
| WO | WO-2018141367 A1 * 8/2018 ....... H01L 21/68728 |
| WO | WO 2019/203404 A1 | 10/2019 |
| WO | WO-2023176605 A1 * 9/2023 ............. B25B 5/061 |

* cited by examiner

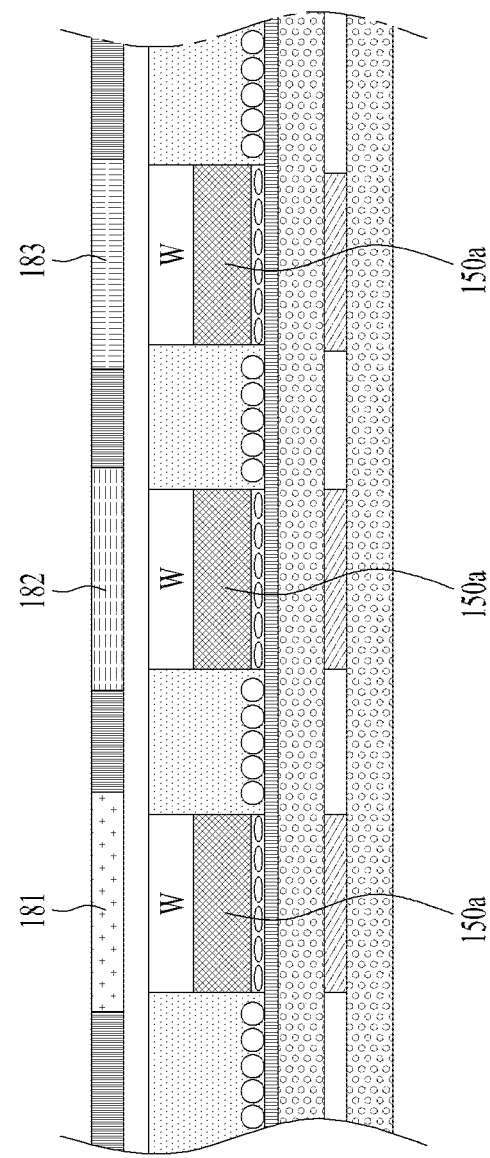

APPARATUS AND METHOD OF MANUFACTURING DISPLAY USING LIGHT EMITTING ELEMENT

CROSS REFERENCE TO RELATED APPLICATIONS

This application is the National Stage filing under 35 U.S.C. 371 of International Application No. PCT/KR2020/000138, filed on Jan. 3, 2020, which claims the benefit of earlier filing date and right of priority to Korean Application No. 10-2019-0175386, filed on Dec. 26, 2019, the entire contents of all these applications are hereby expressly incorporated by reference into the present application.

TECHNICAL FIELD

The present disclosure is applicable to a display device-related technical field, and relates, for example, to a display device using a micro LED (light emitting diode) and a method for manufacturing the same.

BACKGROUND ART

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time that is not fast, and is difficult to be flexibly implemented.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

The size of such a semiconductor light emitting element has recently been reduced to tens of micrometers. Therefore, when a display device is implemented using such small-sized semiconductor light emitting elements, a large number of semiconductor light emitting elements should be assembled on a wiring substrate of the display device.

However, in the process of assembling such light emitting elements, there is a problem that it is very difficult to precisely position a large number of semiconductor light emitting elements at a desired position of the wiring substrate.

Therefore, there is a need for a way to overcome this problem.

DISCLOSURE

Technical Tasks

One technical task of the present disclosure is to provide an apparatus for manufacturing a display device using light emitting elements and method therefor, thereby improving an assembly rate in the display device using the light emitting elements.

Another technical task of the present disclosure is to provide an apparatus for manufacturing a display device using light emitting elements and method therefor, thereby improving an assembly rate by optimally designing magnetization intensity for each substrate portion along a moving path of a light emitting element chip in a manner of adjusting magnetic force according to a process step using a magnetic chuck with an electromagnet.

Technical Solutions

In one technical aspect of the present disclosure, provided is a method of manufacturing a display device using a light emitting element, the method including providing a substrate having an individual pixel position defined by a pair of assembly electrodes, moving the light emitting element including a magnetic body on the substrate using a magnetic chuck having an electromagnet, assembling the light emitting element at the individual pixel position using the magnetic chuck, and recovering a remaining light emitting element failing to be assembled at the individual pixel position using the magnetic chuck.

The moving of the light emitting element may include applying a first current to the electromagnet of the magnetic chuck and the assembling of the light emitting element may include applying a second current different from the first current to the electromagnet of the magnetic check.

A size of the first current may be greater than a size of the second current.

The recovering of the remaining light emitting element may include applying a third current to the electromagnet of the magnetic chuck.

A size of the third current may have a level between the size of the first current and the size of the second current.

The method may include supplying the light emitting element using a vertically transportable tray after the providing of the substrate.

The assembling of the light emitting element may be performed in a manner of rotating the magnetic chuck within a predetermined radius.

The assembling of the light emitting element may include rotating the magnetic chuck at a predetermined frequency.

In another technical aspect of the present disclosure, provided is an apparatus for manufacturing a display device using a light emitting element, the apparatus including a plate to support a substrate including an individual pixel position, a supplier to supply a multitude of light emitting elements including magnetic bodies to a first side of the substrate, respectively, and a magnetic chuck configured to be movable in X, Y and Z directions and to assemble the light emitting element at the individual pixel position of the substrate using an electromagnet on a second side of the substrate.

The magnetic chuck may include a metal tip of a cylindrical rod configuration, a coil coupled to the metal tip, a rotating mechanism rotating the metal tip, and a power supplier to supply a power to the coil.

The rotating mechanism may rotate the metal tip within a predetermined radius.

The magnetic chuck may include a multitude of metal tips and coils provided with predetermined spacing.

The magnetic chuck may include a head having a multitude of metal tips.

The apparatus may further include a tray configured vertically transportable with respect to the substrate and supplying the light emitting element.

A current of a different level may be applied to the magnetic chuck depending on a process for assembling the light emitting element at the individual pixel position of the substrate.

Advantageous Effects

According to one embodiment of the present invention, there are the following effects.

First, according to an apparatus for manufacturing a display device of the present disclosure it the magnetization intensity of a magnetic chuck can be adjusted during a manufacturing process of the display device.

Thus, if the magnetization intensity (intensity of magnetic force) for each process step can be adjusted, it may be useful to increase an assembly rate successfully.

On the other hand, since resistance varies depending on a position of a substrate for each assembly portion and a magnetization distance between a metal tip and a light emitting element chip may vary due to unevenness and bending according to a size of the substrate, magnetization intensity may be optimally designed for each substrate portion along a moving path of the light emitting element chip.

In addition, according to an embodiment of the present disclosure, assembly for various types of substrates is available. That is, an assembly rate may be maintained by adjusting the strength of a magnetic field even in surface unevenness or bending of a large-scale substrate.

Furthermore, according to another embodiment of the present disclosure, there are additional effects not mentioned herein. Those of ordinary skill in the art may understand it through the full text of the specification and drawings.

DESCRIPTION OF DRAWINGS

FIGS. 5A to 5C are conceptual diagrams illustrating various examples of color implementation with respect to a flip-chip type semiconductor light emitting element.

BEST MODE FOR DISCLOSURE

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like.

Figure 1:
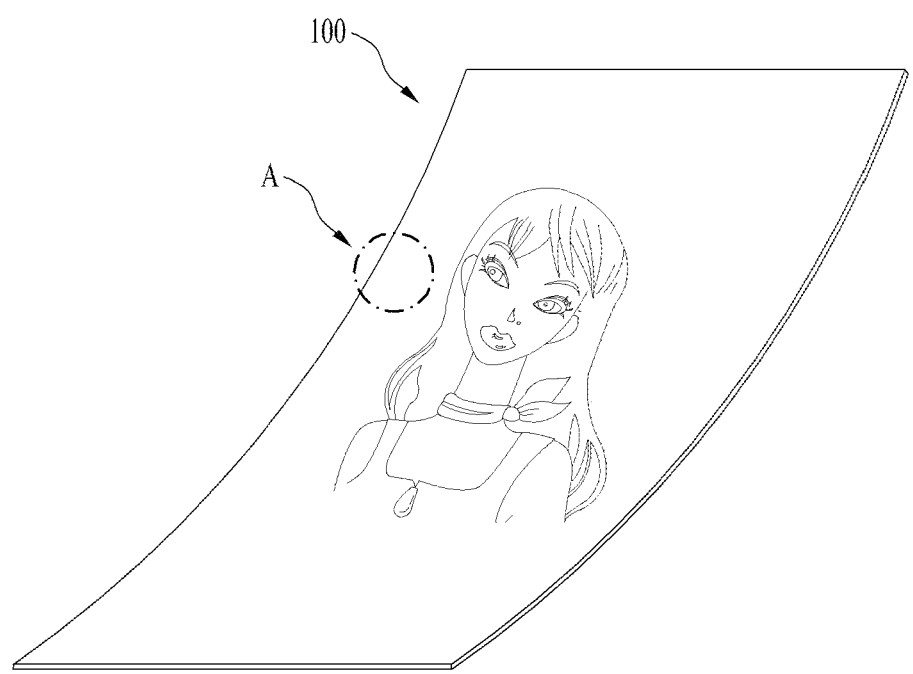
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first state is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
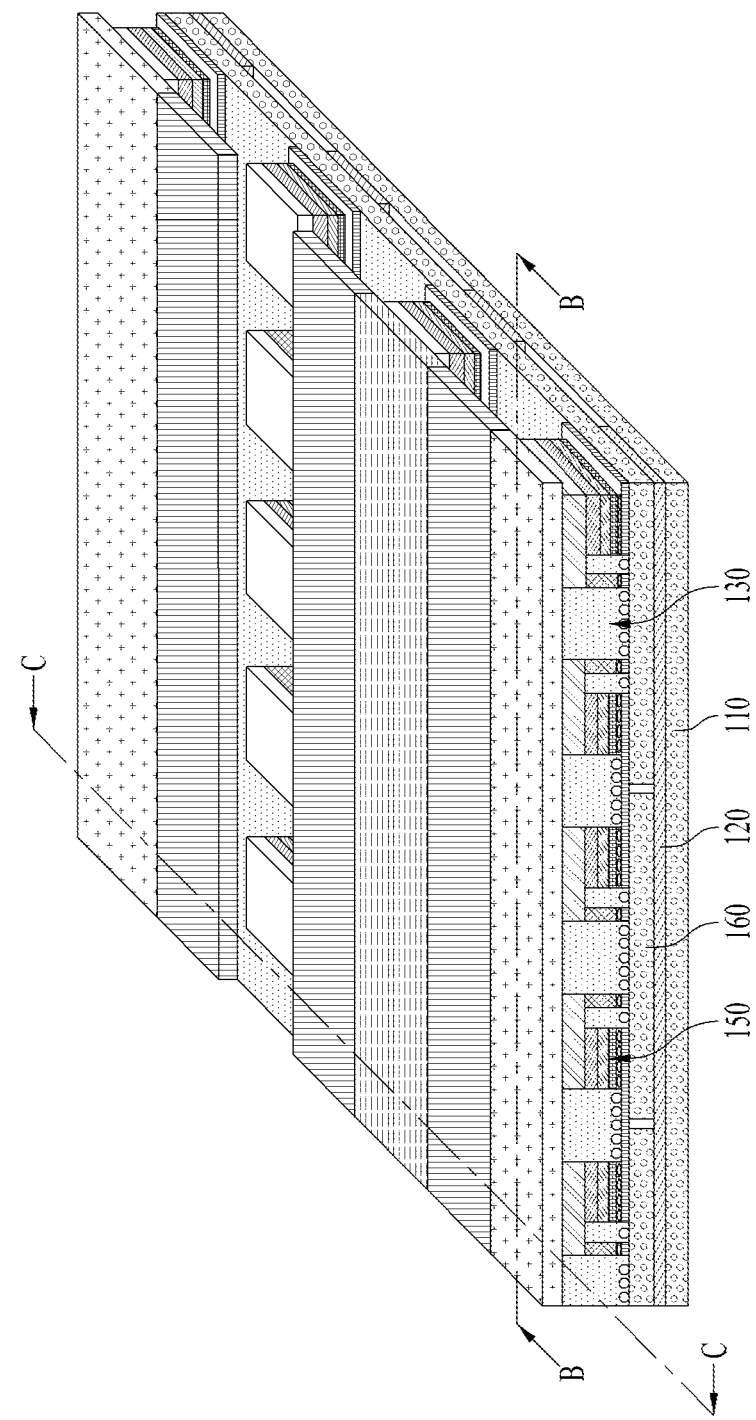
FIG. 2 is a partially enlarged diagram showing a part A shown in FIG. 1.

FIG. 2 is a partially enlarged view showing part A of FIG. 1.

Figure 3A:
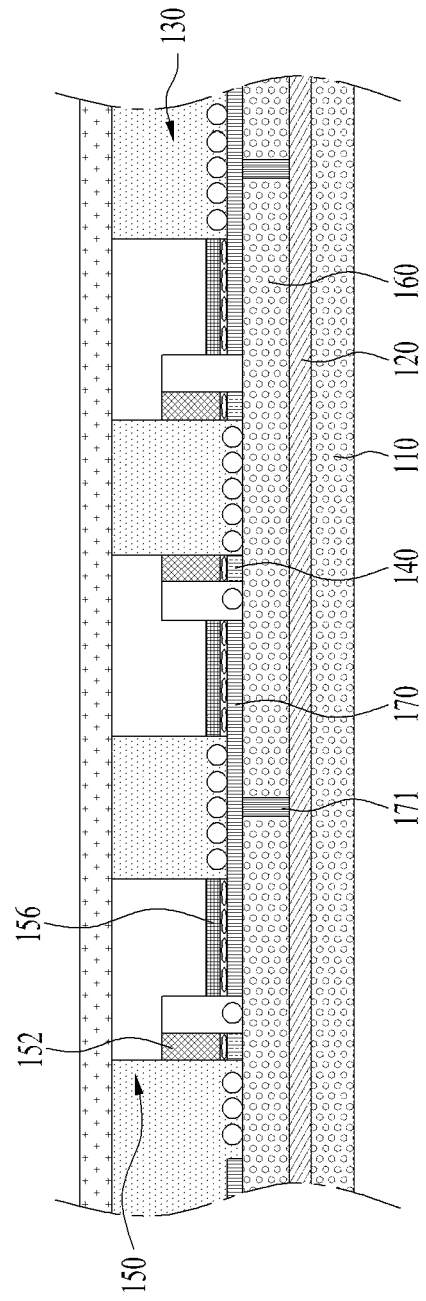
FIGS. 3A and 3B are cross-sectional diagrams taken along the cutting lines B-B and C-C in FIG. 2.
Figure 3B:
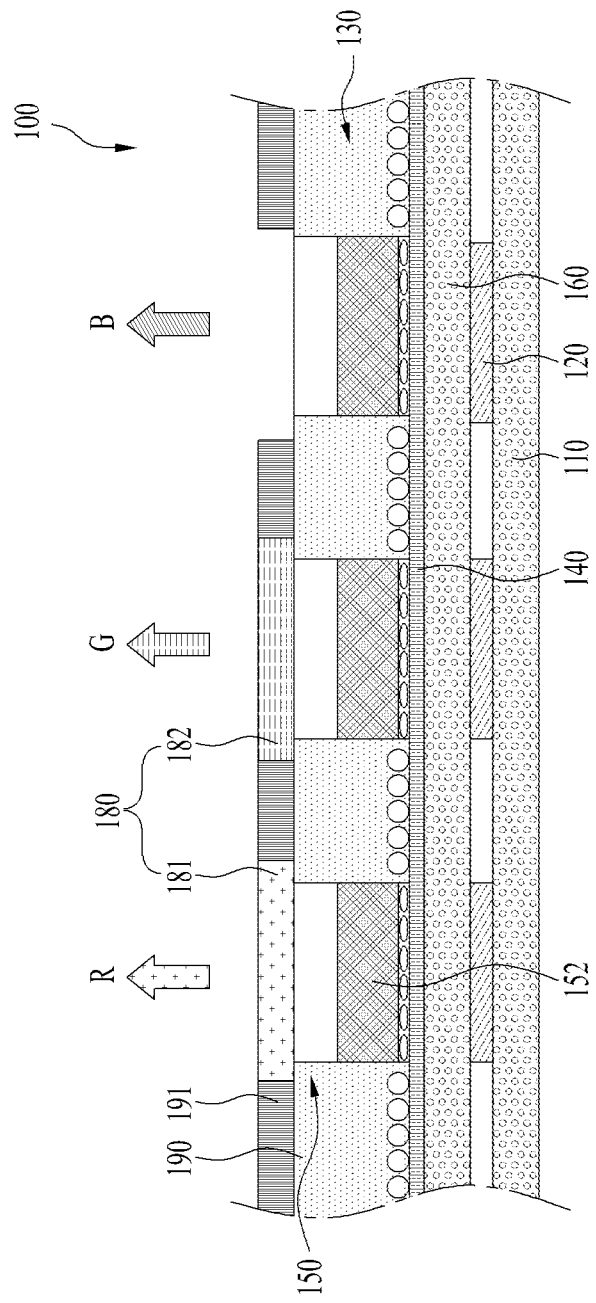

FIGS. 3A and 3B are cross-sectional views taken along lines B-B and C-C in FIG. 2.

Figure 4:
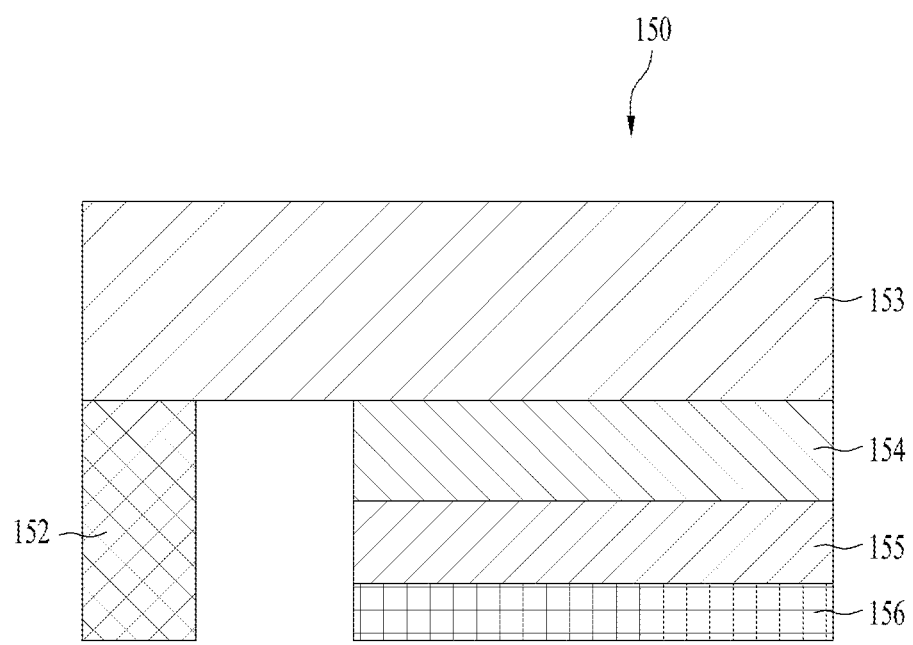
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
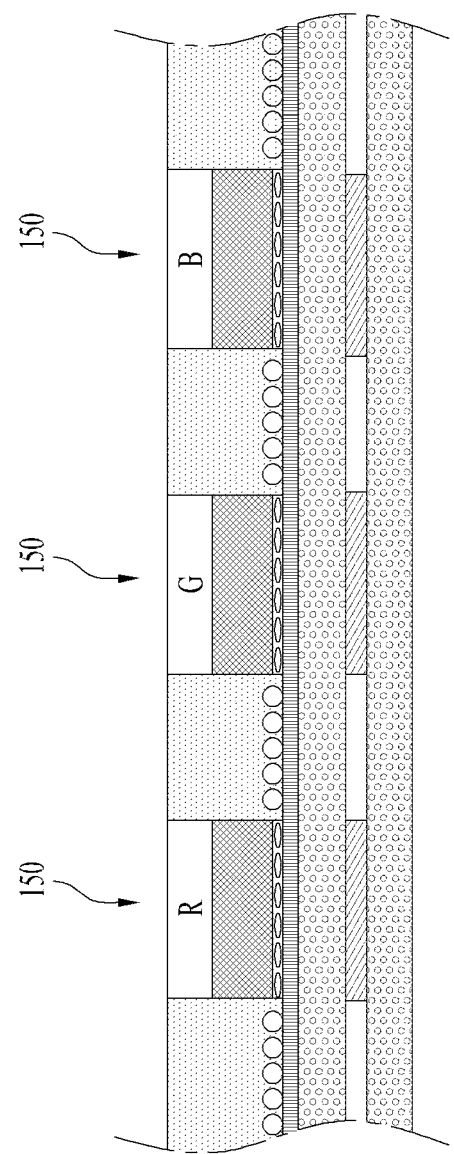
Figure 5C:
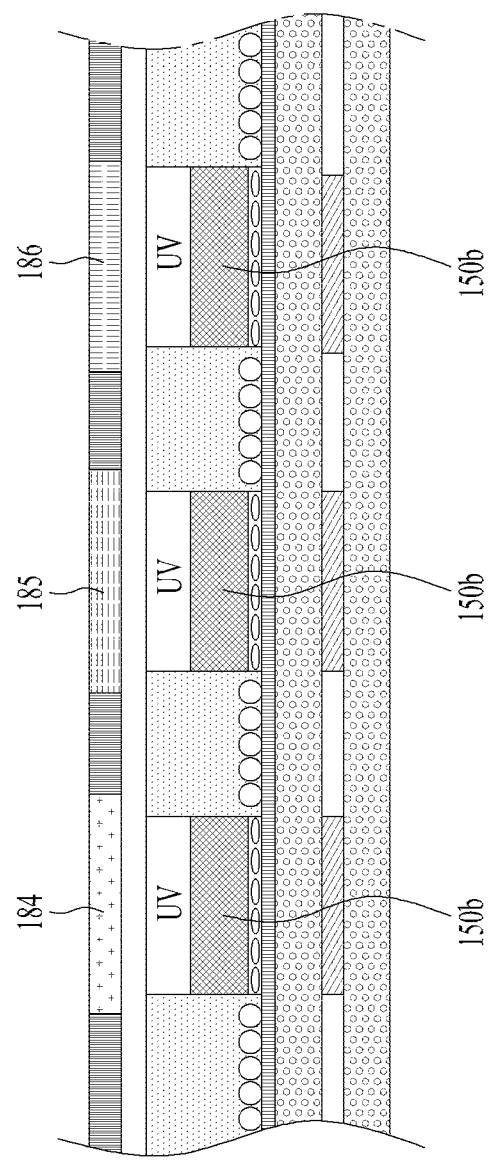

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip chip-type light emitting device.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting device array, and a phosphor conversion layer 180 may be formed on the light emitting device array.

The light emitting device array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting device emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting device W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting device W. In addition, a unit pixel may be formed using a color filter repeating red, green, and blue on the white light emitting device W.

Referring to FIG. 5C, a red phosphor conversion layer 181, a green phosphor conversion layer 185, and a blue phosphor conversion layer 183 may be provided on an ultraviolet light emitting device. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 µm or less, and the device may have a rectangular or square shape. When the semiconductor light emitting element has a rectangular shape, the size thereof may be less than or equal to 20 µm×80 µm.

In addition, even when a square semiconductor light emitting element having a side length of 10 µm is used as a unit pixel, sufficient brightness to form a display device may be obtained.

Therefore, for example, in case of a rectangular pixel having a unit pixel size of 600 µm×300 µm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
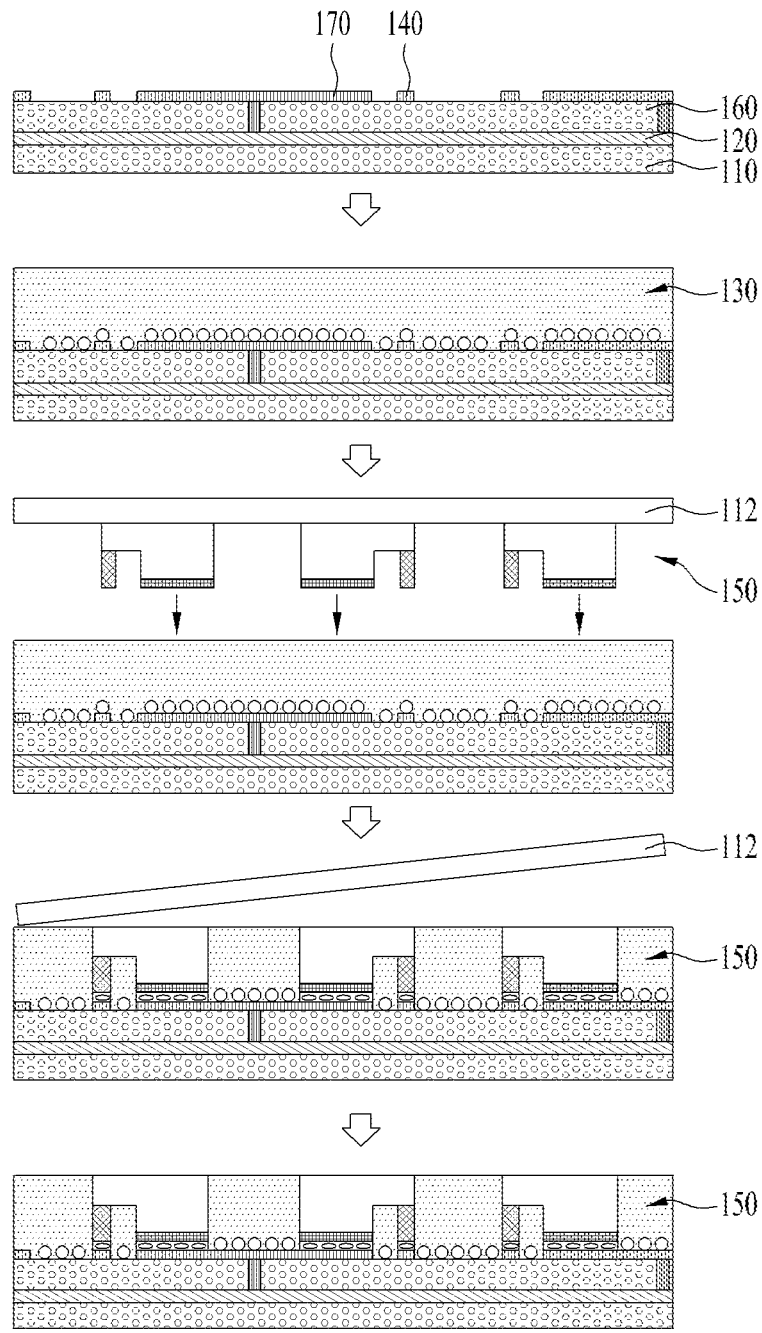
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
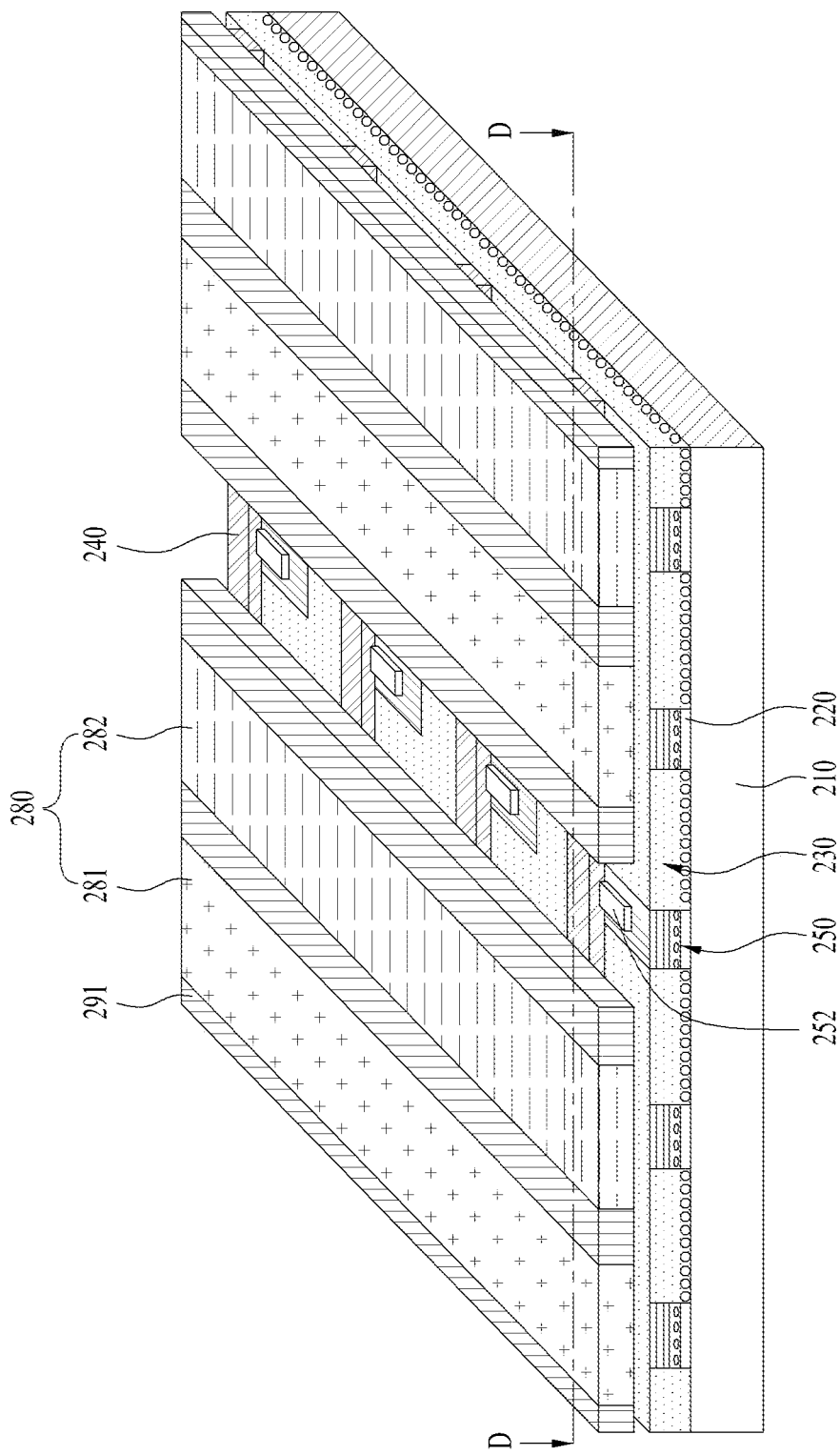
FIG. 7 is a perspective diagram of a display device using a semiconductor light emitting element according to another embodiment of the present disclosure.
Figure 8:
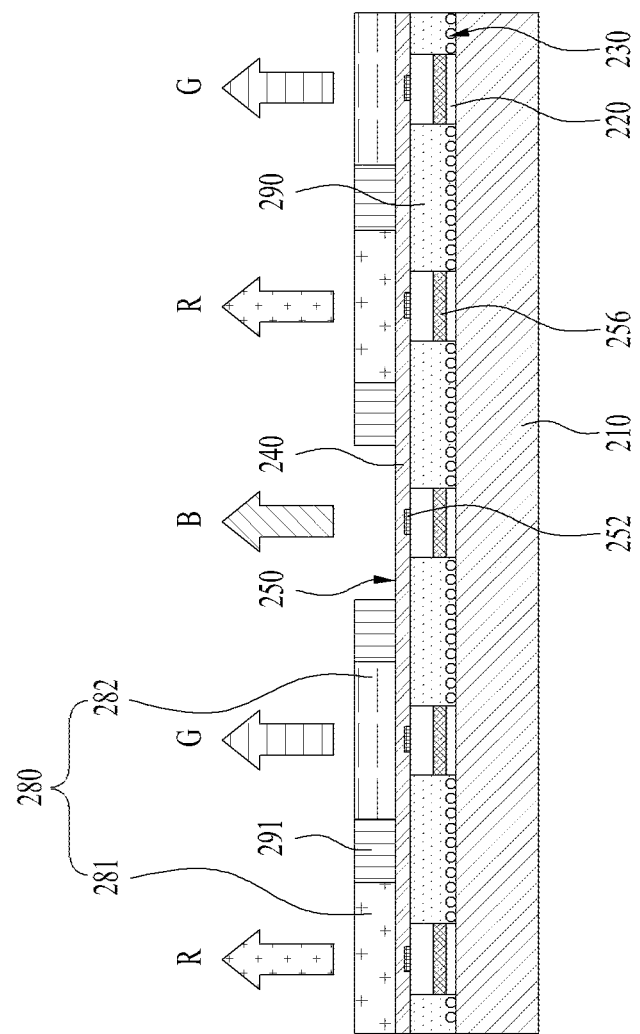
FIG. 8 is a cross-sectional diagram taken along a cutting line D-D shown in FIG. 8.
Figure 9:
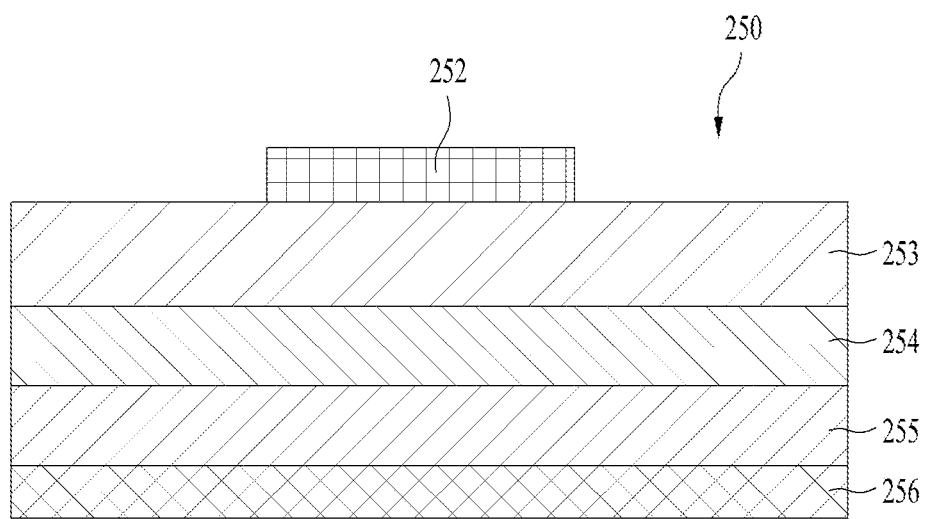
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting device of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting device of a flip chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 µM for example and the individual semiconductor light emitting element 250 may include a rectangular or square element. For example, the rectangular element may have a size equal to or smaller than 20 µm×80 µm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include an n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

In the display device using the semiconductor light-emitting element of the present disclosure described above, the semiconductor light-emitting element grown on a wafer is placed on a wiring substrate in the flip-chip form and used as an individual pixel.

Figure 10:
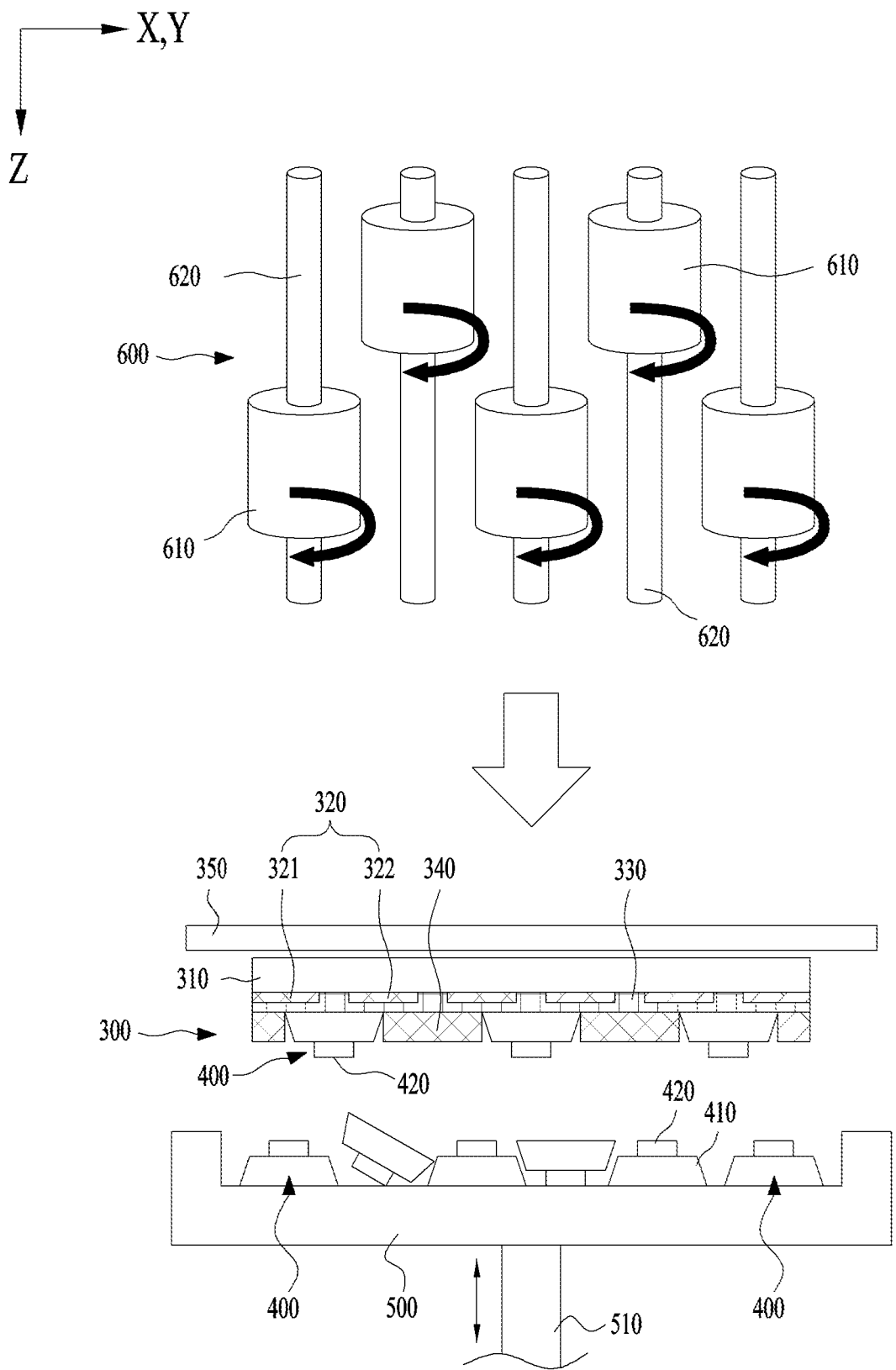
FIG. 10 is a schematic diagram showing a process for manufacturing a display device using an apparatus for manufacturing a display device using light emitting elements according to one embodiment of the present disclosure.

FIG. 10 is a schematic diagram showing a process for manufacturing a display device using an apparatus for manufacturing a display device using light emitting elements according to one embodiment of the present disclosure.

Referring to FIG. 10, an individual light emitting element 400 may be assembled at a pixel position of an assembly substrate 300 at which an individual pixel position is defined by a pair of assembly electrodes 320 and a partition 340.

Figure 16:
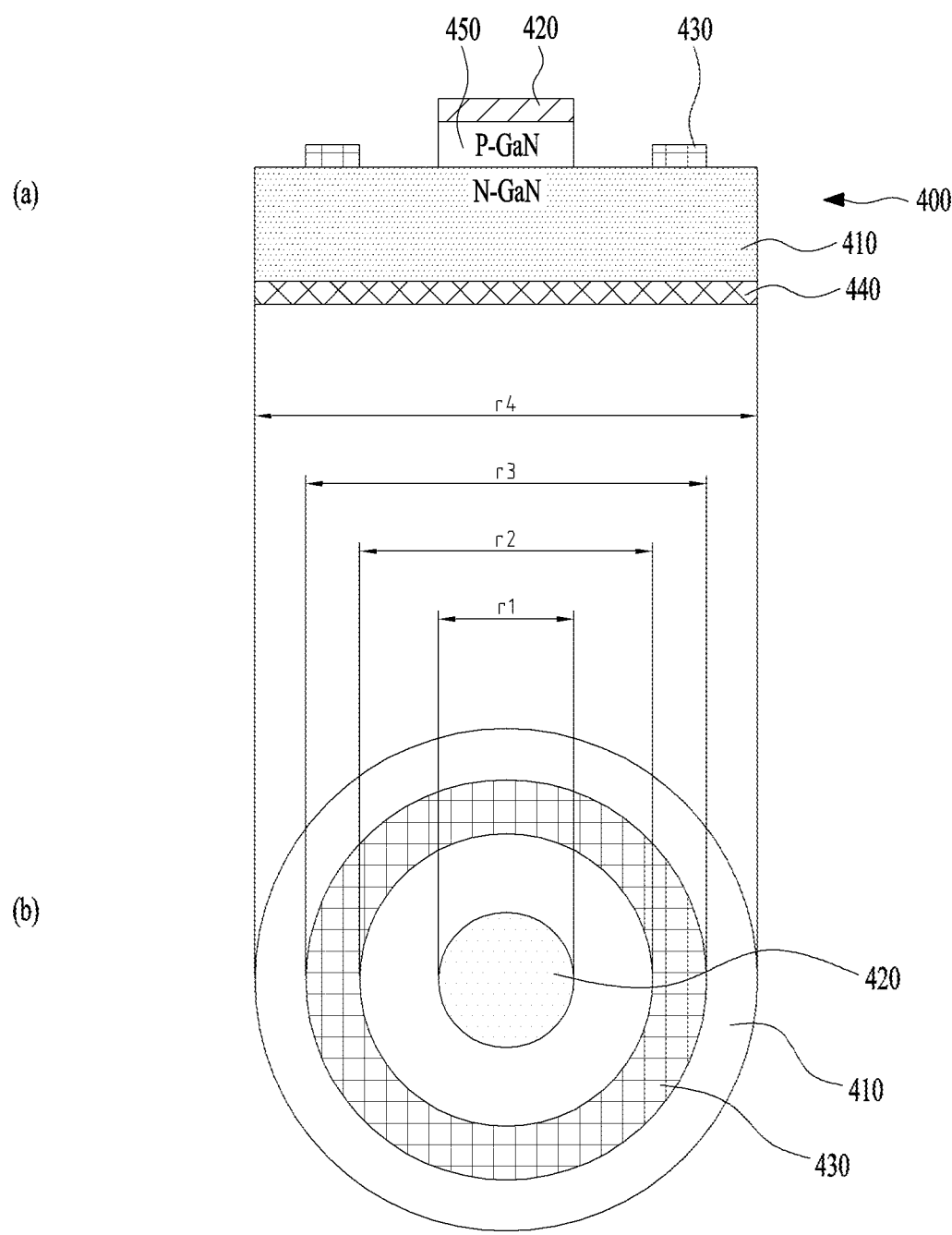
FIG. 16 is a diagram showing one example of a light emitting element of a display device using light emitting elements according to one embodiment of the present disclosure.

In this case, the individual light emitting element 400 may include a magnetic body 430 (see FIG. 16). Hence, the light emitting element 400 may be assembled at the pixel position in a manner of being attracted by a magnetic force of a magnetic chuck 600.

The substrate 300 including the individual pixel position may be supported by a plate 350. In addition, the substrate 300 may be supported so that the individual pixel position may face downward.

Thus, a multitude of the light emitting elements 400 are supplied to the substrate supported by the plate 350, and the light emitting element 400 may be assembled at the individual pixel position located on one side (hereinafter, a first side) of the substrate 300 by the magnetic chuck 600.

The magnetic chuck 600 can be transported in three directions of X, Y and Z. and may assemble the light emitting element 400 at the individual pixel position of the substrate 300 using an electromagnet on a second side opposite to the first side of the substrate 300.

Such a magnetic chuck 600 may include a metal tip (i.e., a magnetic head) 620 in a cylindrical rod shape and a coil (or a solenoid) 610 coupled to the metal tip 620 to generate a magnetic force.

In this case, the direction Z may include a direction toward the substrate 300, and the directions X and Y may include directions moving in a primary plane of the substrate 300. For example, by transporting the magnetic chuck 600 in the direction Z, the magnitude of the magnetic force can be changed. For example, when the magnetic chuck 600 is placed at a position closest to the plate 350 by being transported in the direction Z, the greatest magnetic force may be applied to the light emitting element 400.

In addition, by transporting the magnetic chuck 600 in the directions X and Y, the light emitting element 400 may be mounted at the individual pixel position. In addition, by transporting the magnetic chuck 600 in the directions X and Y, the remaining light emitting element 400 failing to be mounted at the pixel position may be recovered.

Meanwhile, as the magnetic chuck 600 is rotated, a periodic force may be applied so that the light emitting element 400 can be accurately seated at a pixel position. For example, the metal tip 620 of the magnetic chuck 600 may be periodically rotate with eccentricity within a predetermined range. In this process, the light emitting element 400 located within the predetermined range is attracted to the pixel position, whereby the probability of being assembled at an accurate position may be increased.

Such an assembly process may be performed in a fluid. For example, the semiconductor light emitting device 400 and the substrate 300 are positioned in a fluid-filled chamber, and the light emitting device 400 is assembled to the substrate 300 by itself using gravity, surface tension, magnetic force, electric force, etc. This process may be referred to as a self-assembly process.

In this case, the substrate 300 may include an assembly substrate. Such an assembly substrate may include a substrate for temporarily mounting the light emitting element 400 thereon so as to transfer it to a substrate (e.g., a wiring substrate) configuring a display device.

Such an assembly substrate may have multiple pairs of assembly electrodes 320 (i.e., 321 and 322) disposed on the base substrate 310, and an insulating layer 330 may be located on the electrode 320. In addition, a partition 340 defining a pixel position may be placed at a position corresponding to the assembly electrode 320.

For another example, a wiring substrate is placed in a fluid chamber instead of an assembly substrate, and thus the light emitting elements 400 may be directly seated on the wiring substrate. In this case, the substrate 300 may include the wiring substrate. For convenience of description, in the example of the present disclosure, as the substrate 300 is provided with an assembly substrate, the light emitting elements 400 are seated thereon.

Meanwhile, in order to apply the above-described self-assembly method to the fabrication of a large-screen display, it is necessary to raise a transfer yield. In order to increase the transfer yield, the present disclosure proposes a method and apparatus for minimizing the influence of gravity or frictional force and preventing non-specific coupling.

In addition, the present disclosure intends to propose an apparatus and method for more efficiently assembling the light emitting device 400 by applying an electromagnet to the magnetic chuck 600 and applying different magnitudes of magnetic forces in the assembly process of the light emitting device 400.

In this case, the display device according to the present disclosure may dispose a magnetic body 430 (see FIG. 16) on the semiconductor light emitting element 400 to move the semiconductor light emitting element 400 using a magnetic force of the magnetic chuck 600, and may have the light emitting element 400 seated at a preset position using a magnetic field in such a moving process.

Figure 11:
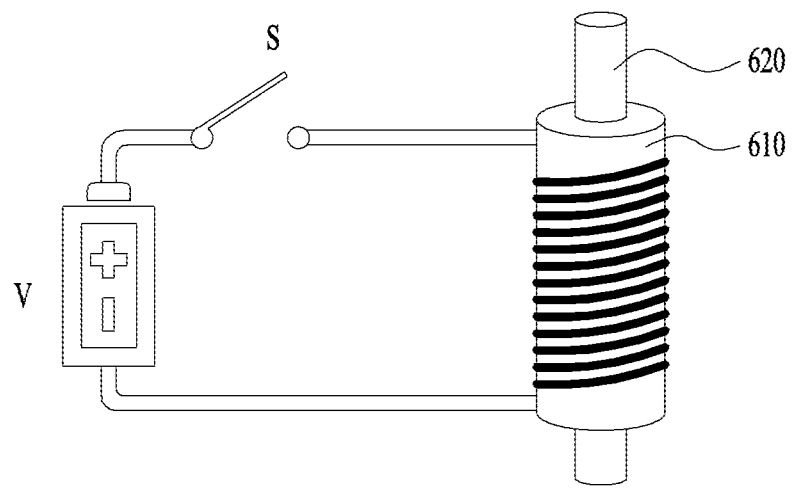
FIG. 11 is a conceptual diagram showing one example of a magnetic chuck applied to an apparatus for manufacturing a display device using light emitting elements according to one embodiment of the present disclosure.
Figure 12:
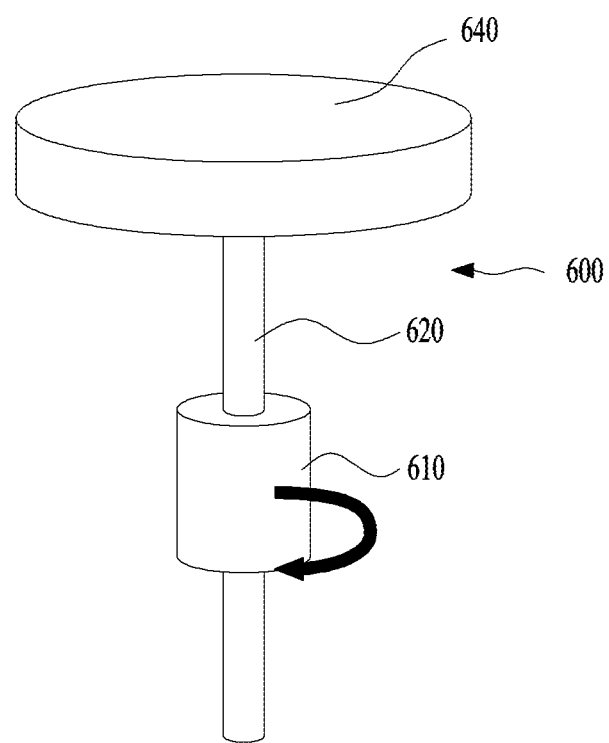
FIG. 12 is a schematic diagram showing one example of a magnetic chuck applied to an apparatus for manufacturing a display device using light emitting elements according to one embodiment of the present disclosure.

FIG. 11 is a conceptual diagram showing one example of a magnetic chuck applied to an apparatus for manufacturing a display device using light emitting elements according to one embodiment of the present disclosure. FIG. 12 is a schematic diagram showing one example of a magnetic chuck applied to an apparatus for manufacturing a display device using light emitting elements according to one embodiment of the present disclosure.

Referring to FIG. 11, the magnetic chuck 600 may include the metal tip 620 of a cylindrical rod type and the coil (solenoid) 610 coupled to the metal tip 620. In addition, a power supplier V for supplying a power to the coil 610 and a switch S may be included. This, the magnetic chuck 600 may have an electromagnet form. For convenience, the coil 610 may be referred to as an electromagnet.

Therefore, a current/voltage may be applied to the coil 610 by controlling the switch S, and thus, the metal tip 620 may have a magnetic force only when the current/voltage is applied to the coil (electromagnet) 610.

In this case, the thickness, the number of windings, and the length of the coil 610 may vary depending on the substrate 300, the light emitting element (chip) 400, and other process equipments. For example, the thickness range of the coil 610 may be 0.1 to 5 mm. In addition, the number of windings of the coil 610 may be 100 to 100,000. Meanwhile, the length of the coil 610 may be 1 to 100 m.

The metal tip 620 may use a metal structure made of a material having ferromagnetism. The model and size of the metal tip 620 may be selected according to the shapes of the substrate 300 and the light emitting element 400. As an example of the metal tip 620, iron (Fe), nickel (Ni), cobalt (Co), or the like may be used.

Unlike an embodiment of the present disclosure, if a permanent magnet, not an electromagnet, is used for a magnetic chuck, it may be necessary to use a cylindrical magnet having the same shapes at both ends depending on the symmetry of a magnetic field. However, when an electromagnet is applied to the magnetic chuck 600 like the embodiment of the present disclosure, various types of metal tips 620 may be applicable depending on the shapes of the substrate 300 and the light emitting element 400.

For example, when the size of the light emitting element 400 is small, the content of a magnetic material (e.g., nickel (Ni)) responding to a magnetic field of the light emitting element 400 is relatively small, or assembly is performed using a portion of the light emitting element 400, the magnetic field may be concentrated to facilitate the movement of the light emitting element 400. In this case, an end portion of the metal tip 620 may be formed narrow and sharp.

On the other hand, when there are a very large number of pixel positions in the substrate 300, and in this situation, when a large amount of light emitting elements 400 need to be assembled at once, a wide-sized metal tip 620 may be applied.

In addition, the metal tip 620 having one of various shapes may be applied according to the shape of the pixel position in the substrate 300. For example, if the shape of each of the light emitting element 400 and the pixel position has a shape other than a square, the metal tip 620 having a corresponding shape may be applied.

Meanwhile, the magnitude of the magnetic force acting on the metal tip 620 may vary according to a level of the applied current/voltage.

In this way, by forming a magnetic field with an electrical signal, movement and assembly of the light emitting element (chip) 400 may be easily controlled.

For example, when the chip 400 is moved, a magnetic field is formed by flowing a current to move the chip 400. And, a substrate assembly rate of the chip by the electric field may be increased by adjusting the flow of the current as assembly proceeds. Thereafter, when the assembly of the chip 400 in the substrate 300 is completed, the chip movement may be smoothly controlled by adjusting the current when the chip is moved again for chip collection and the like.

For specific example, in a process of moving the light emitting element 400, a first current may be applied to the coil (electromagnet) 610 of the magnetic chuck 600.

Thereafter, in the process of assembling the light emitting element 400, a second current having a level lower than that of the first current may be applied to the coil 610.

In addition, in a process of recovering the remaining light emitting element 400 that are not assembled, a third current may be applied to the coil 610 of the magnetic chuck 600. In this case, the third current may have a level between a level of the first current and a level of the second current.

In other words, a current may be made to selectively flow to the magnetic chuck 600 only when the light emitting element 400 is moved. In this case, a high voltage/current/ frequency may be applied to facilitate the movement of the light emitting element 400.

Thereafter, when the light emitting element 400 is assembled, a voltage/current/frequency, which is lower than that for the movement of the light emitting element 400, may be applied to the coil (electromagnet) 610 of the magnetic chuck 600. This may be to increase the probability of substrate assembly of the light emitting element 400.

Next, when substrate cleaning and chip recovery are performed after completion of the assembly of the light emitting element 400, a voltage/current/frequency having a size between a size for substrate movement and a size for assembly may be applied.

Meanwhile, referring to FIG. 12, a rotating mechanism 640 for rotating the metal tip 620 may be coupled to the magnetic chuck 600. As described above, the rotating mechanism 640 may apply a rotational force so that the metal tip 620 may be eccentrically rotated within a predetermined range. This will be described in detail later.

Figure 13:
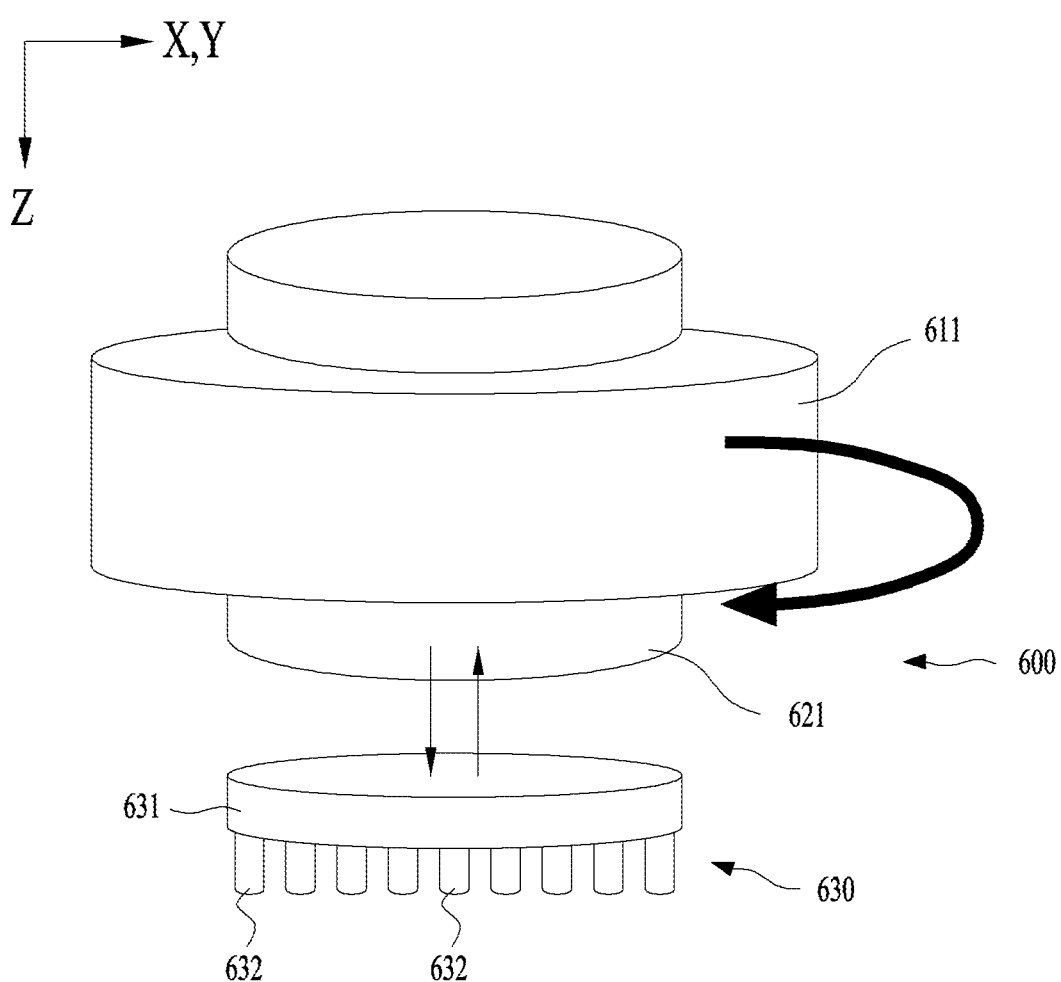
FIG. 13 is a schematic diagram showing another example of a magnetic chuck applied to an apparatus for manufacturing a display device using light emitting elements according to one embodiment of the present disclosure.

FIG. 13 is a schematic diagram showing another example of a magnetic chuck applied to an apparatus for manufacturing a display device using light emitting elements according to one embodiment of the present disclosure.

Referring to FIG. 13, the magnetic chuck 600 may use a large metal tip 621 and a large coil 611 that can be wound around such a large metal tip 621. In addition, a detachable head 630 provided with a multitude of small metal tips 632 on a disk-shaped base 631 may be used for such a large metal tip 621.

The spacing of a multitude of the small metal tips 632 may correspond to the spacing of the pixel (or subpixel) positions formed on the substrate 300. The pixel positions may be different depending on the substrate 300, and the head 630 having the spacing of the metal tip 632 corresponding to such a pixel position may be selectively used.

As described with reference to FIG. 12, a metal structure made of a ferromagnetic material may be used as the head 630 including a large metal tip 621 and a multitude of metal tips 632. The model and size of the metal tips 621 and 632 may be selected according to the shapes of the substrate 300 and the light emitting element 400. Examples of the metal tips 621 and 632 may include iron (Fe), nickel (Ni), cobalt (Co), and the like.

Although not separately illustrated, a rotating mechanism 640 (see FIG. 12) for rotating the metal tips 621 and 632 may be coupled. As described above, the rotating mechanism 640 may apply a rotational force so that the metal tips 621 and 632 may be eccentrically rotated within a predetermined range.

A magnetic field strength of an electromagnet increases in proportion to the length of a coil and the number of coil windings. Therefore, a parent body of the electromagnet may be manufactured separately into various deformable components such as a tip part (e.g., the head 630), which is an area to be manufactured and assembled by a large instrument.

In this case, by detachably separating an area (i.e., the metal tip 621 and the coil 611) generating a magnetic field and an area of the head 630 from each other, an assembly rate may be improved while a magnetic force is maximized.

In addition, as described above, the magnetic chuck 600 may be transported in three directions X, Y. and Z, and may assemble the light emitting element 400 at an individual pixel position of the substrate 300 by using an electromagnet on a second side opposite to a first side of the substrate 300.

In this case, the direction Z may be a direction in which the magnetic chuck 600 faces the substrate 300, and the directions X and Y may be directions in which the magnetic chuck 600 moves on a main plane of the substrate 300. For example, the magnetic chuck 600 may be transported in the direction Z to change the magnitude of the magnetic force acting on the light emitting element 400. For example, when the magnetic chuck 600 is positioned closest to the plate 350 by being transported in the direction Z, the greatest magnetic force may be applied to the light emitting element 400.

In addition, the magnetic chuck 600 may be transported in the directions X and Y so that the light emitting element 400 may be mounted at an individual pixel positions In addition, by transporting the magnetic chuck 600 in the directions X and Y, the remaining light emitting element 400 without being mounted at the pixel position may be recovered.

Referring back to FIG. 10, a magnetic chuck 600 may be configured by positioning a plurality of electromagnets in parallel. In this case, a multitude of metal tips 620 and a coil 610 may be disposed to correspond to the spacing of pixel (or subpixel) positions formed on the substrate 300. The pixel positions may be different from each other depending on the substrate 300, and the magnetic chuck 600 may be configured by setting the spacing of the metal tips 620 corresponding to the pixel positions.

In this case, as shown in FIG. 10, by diversifying a relative position between the metal tip 620 and the coil 610, it may be configured to enable overlapping at positions close to each other. That is, the magnetic chuck 600 may be configured such that the coil 610 is located relatively lower on the metal tip 620 in a first row and the coil 610 is located relatively upper on the metal tip 620 in a second row.

This may be due to the relatively large volume of a part of the coil (solenoid) 610 when the magnetic chuck 600 is configured. That is, since the volume of the coil 610 is large, the magnetic chuck 600 may be alternately configured in a manner that a position of one coil 610 avoids overlapping with a position of an adjacent coil 610.

In this way, the magnetic chuck 600 may include a multitude of metal tips 620 and coils 610 provided with the regular spacing. Of course, a multitude of the metal tips 620 and coils 610 provided with the regular spacing may be simultaneously transported in directions X, Y, and Z.

Meanwhile, referring to FIG. 10, a tray 500 for supplying the light emitting element 400 in the fluid may be provided. As illustrated, while a multitude of the light emitting elements 400 are positioned in the tray 500, they may be transported in a vertical direction, that is, in the direction Z, through a vertical transport part 510.

The light emitting elements 400 may be supplied closer to the substrate 300 through the tray 500, by which the light emitting element 400 may be more accurately positioned at the pixel (or subpixel) position.

For example, after the magnetic chuck 60) has been brought close to the substrate 300, the tray 500 is raised to bring the light emitting element 400 for assembly closer to the substrate 300. In doing so, when the magnetic chuck 600 is periodically rotated within a radius larger than a pixel size above the pixel position while being rotated by being supplied with a magnetic force, the light emitting element 400 may be attached to the pixel position by the magnetic force.

Thereafter, an electric field is generated by applying a current to a pair of the assembly electrodes 320, whereby the light emitting element 400 may be fixed thereto.

In this case, the light emitting element 400 may be assembled at a pixel position while a top electrode 420 is positioned on a lower side. That is, a body portion 410 may be assembled at a pixel position. Although not shown, a bottom electrode may be positioned below the body portion 410. That is, the light emitting element 400 may include a vertical light emitting element. However, the present disclosure is not limited thereto. For example, it is a matter of course that a horizontal light emitting element may be used for the assembly, and such a horizontal light emitting element may be flip-chip bonded or assembled at a regular position.

Figure 14:
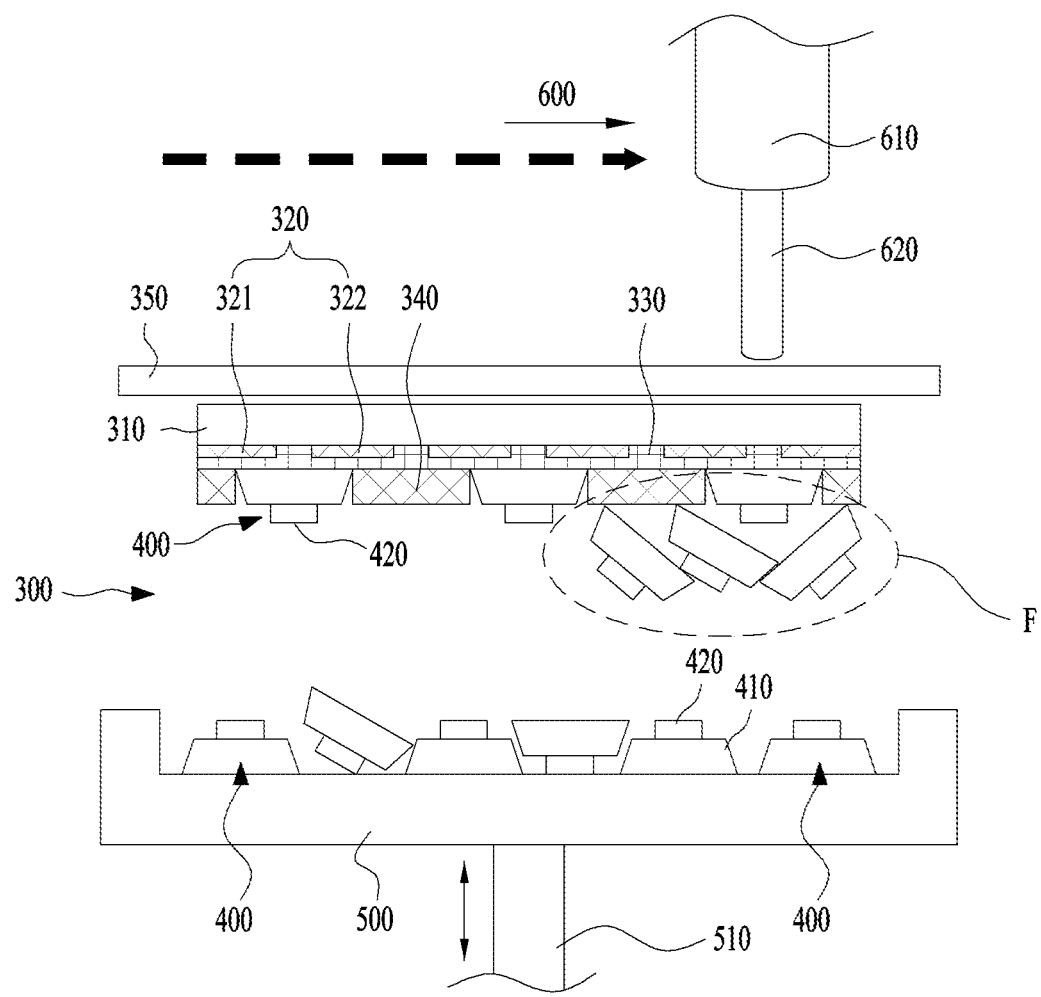
FIG. 14 is a schematic diagram showing another example of a process for manufacturing a display device using an apparatus for manufacturing a display device using light emitting elements according to one embodiment of the present disclosure.

FIG. 14 is a schematic diagram showing another example of a process for manufacturing a display device using an apparatus for manufacturing a display device using light emitting elements according to one embodiment of the present disclosure.

Referring to FIG. 14, by the process described above, an individual light emitting element 400 may be assembled at a pixel position of an assembly substrate 300 in which an individual pixel position is defined by a pair of assembly electrodes 320 and a partition 340.

In this way, a multitude of light emitting elements 400 are supplied to the substrate 300 supported by a plate 350, and the light emitting element 400 may be assembled at an individual pixel position located on one side (e.g., first side) of the substrate 300 by a magnetic chuck 600.

As described above, the magnetic chuck 600 may be transported in the directions X and Y so that the light emitting element 400 may be mounted at the individual pixel position. In addition, by transporting the magnetic chuck 60) in the directions X and Y, the remaining light emitting element 400 without being mounted at the pixel position may be recovered.

In this case, the display device according to the present disclosure may arrange a magnetic body 430 (see FIG. 16) on a semiconductor light emitting element 400 to move the semiconductor light emitting element 400 using a magnetic force of the magnetic chuck 600, and may seat the light emitting element 400 at a preset position.

After the light emitting element 400 has been assembled at the pixel position through the electric field, the remaining chips of the light emitting elements 400 may be collected using a magnetic field by applying a larger current.

In this case, since the light emitting elements 400 are respectively assembled to the pixel positions and fixed by using the electric field, the remaining chip may be recovered in a manner of aligning the metal tip 620 in one direction (e.g., the direction X) while applying a predetermined magnetic force.

FIG. 14 shows a process for transporting a group F of remaining chips by the transport of the metal tip 620.

In doing so, as described above, a tray 500 is available.

Thereafter, by lowering the tray 500, the remaining light emitting elements 400 may be recovered to the outside of the manufacturing equipment.

In some implementations, when a chip collecting process is performed by the magnetic chuck 600 in a manner of differentiating the intensity of the magnetic field, the tray 500 may not be used.

Figure 15:
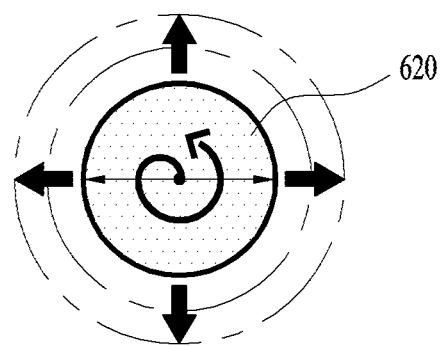
FIG. 15 is a schematic diagram representing a movement of a metal tip in the course of a process for manufacturing a display device using light emitting elements according to one embodiment of the present disclosure.

FIG. 15 is a schematic diagram representing a movement of a metal tip in the course of a process for manufacturing a display device using light emitting elements according to one embodiment of the present disclosure.

As described above, by rotating the magnetic chuck 600, a periodic force may be applied so that the light emitting element 400 may be accurately seated at the pixel position.

For example, the metal tip 620 of the magnetic chuck 600 may be periodically rotated with an eccentricity within a predetermined range. That is, the metal tip 620 may not rotate around the center of its own, but may rotate at a predetermined frequency so as to eccentrically scan an area larger than the area of the metal tip 620.

In this case, the area that can be scanned may be changed according to a size of a pixel. That is, if the size of the pixel is large, the rotation may be performed to scan an area occupied by this pixel with a larger eccentric radius.

In this process, the light emitting element 400 positioned within such a predetermined range may be attracted to a pixel position, and thus a probability that the light emitting element 400 may be assembled at an accurate position may increase.

An internal arrow in FIG. 15 schematically indicates a trajectory where the metal tip 620 rotates, and an external arrow indicates that a scan area of the metal tip 620 is changeable.

As described above, according to the manufacturing apparatus of the present disclosure, the magnetization intensity of the magnetic chuck 600 is adjustable during the manufacturing process of the display device.

First, for each process, in order to smoothly and efficiently move a chip of a multitude of light emitting elements 400 in the early stage of an assembly process, a magnet having a high magnetization intensity is required.

However, while assembly is in progress on the substrate 300, when a magnetic force is large, the light emitting element 400 is not assembled and chips attracted toward the magnetic chuck 600 may be generated. Therefore, if the magnetization intensity (intensity of magnetic force) for each process step can be adjusted, it may be useful in increasing a successful assembly rate.

Meanwhile, for each assembly portion, resistance varies according to the position of the substrate 300 and a magnetization distance between the metal tip 620 and the chip of the light emitting device 400 may vary due to unevenness, bending and the like according to the size of the substrate 300. Therefore, the magnetization intensity may be optimally designed according to the movement path of the light emitting device chip for each portion of the substrate 300.

In addition, according to an embodiment of the present disclosure, it is possible to assemble various types of substrates.

That is, the assembly rate may be maintained by adjusting the strength of the magnetic field even in surface unevenness or bending of a large-scale substrate.

For example, a step difference of unevenness/bending and the like may occur in a substrate having a diameter larger than 150 mm, or a thickness may vary per portion, and in this case, an assembly rate may be improved by adjusting a magnetic field of the magnetic chuck 600.

FIG. 16 is a diagram showing one example of a light emitting element of a display device using light emitting elements according to one embodiment of the present disclosure.

Regarding a light emitting element 400 used for a display device, for example, a micro-LED 400 having a size in micrometer unit includes a magnetic body 430 as mentioned above.

An n-electrode 440 is positioned on a bottom side of the light emitting element 400, and a p-type gallium nitride (GaN)-based semiconductor layer (P-GaN) 450 is positioned on an n-type gallium nitride (GaN)-based semiconductor layer (N-GaN) 410. In this case, although not shown, an active layer may be positioned between the n-type gallium nitride (GaN)-based semiconductor layer 410 and the p-type gallium nitride (GaN)-based semiconductor layer 450.

In addition, a p-electrode 420 may be positioned on the p-type gallium nitride (GaN)-based semiconductor layer 450, and a magnetic body 430 may be positioned on both sides of a top side of the n-type gallium nitride (GaN)-based semiconductor layer 410.

In this case, the degree of magnetization may vary according to the volume and design of the magnetic body (Ni) of the light emitting device 400.

In this case, in order to maximize lighting efficiency, when the amount of the magnetic body (Ni) 430 inside the chip is reduced or the shape, size and the like of the magnetic body 430 are limited, the assembly rate may be lowered.

However, as described above, even in this case, the assembly rate may be improved by adjusting the magnetic field of the magnetic chuck 600.

Figure 17:
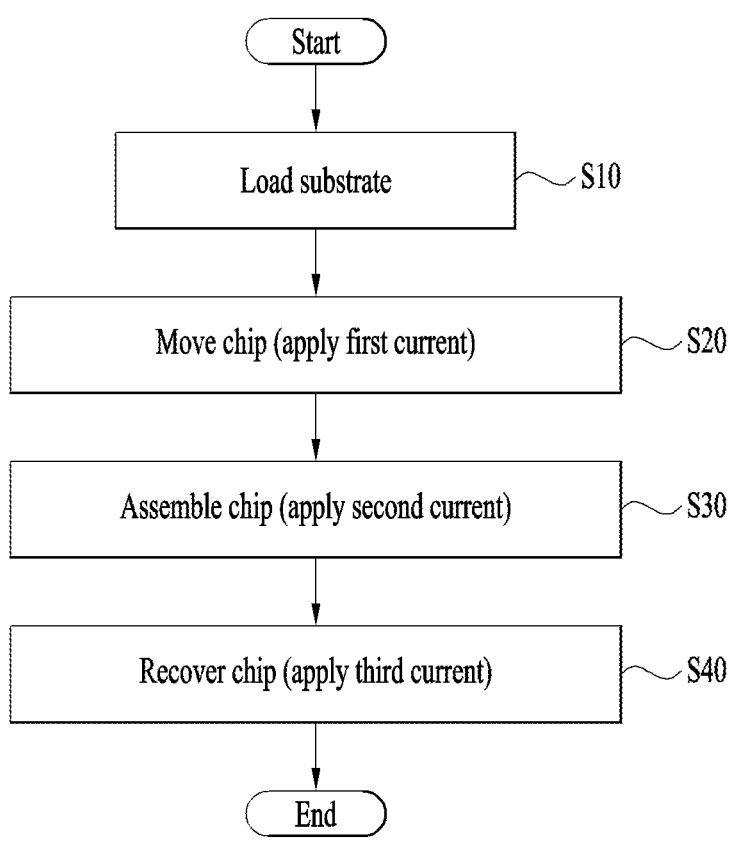
FIG. 17 is a flowchart showing a method of manufacturing a display device using light emitting elements according to one embodiment of the present disclosure.

FIG. 17 is a flowchart showing a method of manufacturing a display device using light emitting elements according to one embodiment of the present disclosure.

Hereinafter, a manufacturing method using an apparatus for manufacturing a display device using a light emitting element according to an embodiment of the present disclosure described above will be described step by step with reference to both FIG. 10 and FIG. 17.

First, the substrate 300 may be loaded at an appropriate position (S10). That is, the substrate 300 in which an individual pixel position is defined by a pair of assembly electrodes 320 may be disposed.

As described above, manufacturing of a display device according to an embodiment of the present disclosure may be performed on a fluid.

As mentioned above, the substrate 300 including individual pixel positions may be supplied by the plate 350 supporting the substrate 300.

In doing so, in some cases, the light emitting element may be supplied using the tray 500 capable of vertical transportation.

Thereafter, the light emitting element (chip) 400 including the magnetic body 430 may be moved on the substrate 300 by using the magnetic chuck 600 having the electromagnet 610.

In this case, in the step S20 of moving the light emitting element 400, a first current may be applied to the coil (electromagnet) 610 of the magnetic chuck 600.

Thereafter, the light emitting element 400 may be assembled by applying a second current smaller than the first current to the coil 610 (S30).

As mentioned above, when a magnetic force is large while assembly is in progress on the substrate 300, chips that are attracted toward the magnetic chuck 600 without assembling the light emitting element 400 may be generated. Accordingly, in the step S30 of assembling the light emitting element 400, a second current having a size smaller than that of the first current may be applied.

In this case, the step of assembling the light emitting element 400 may be performed by rotating the magnetic chuck 600 within a predetermined radius. That is, in the step of assembling the light emitting element 400, the magnetic chuck 600 may be rotated at a predetermined frequency.

Next, a step S40 of recovering the remaining light emitting device 400 that is not assembled may be performed. In this way, in the step S40 of recovering the remaining light emitting elements 400 that are not assembled, a third current may be applied to the coil 610 of the magnetic chuck 600. In this case, the third current may have a level between the first current and the second current.

In other words, a current may be made to selectively flow to the magnetic chuck 600 only when the light emitting element 400 is moved. In this case, a high voltage/current/frequency may be applied to facilitate the movement of the light emitting element 400.

Thereafter, when the light emitting element 400 is assembled, a voltage/current/frequency lower than that in moving the light emitting element 400 may be applied to the coil (electromagnet) 610 of the magnetic chuck 600. This may be to increase the probability of the substrate assembly of the light emitting element 400.

Next, after the assembly of the light emitting element 400 has been finished, when the substrate is cleaned and the chip is collected, a voltage/current/frequency having a size between a size for substrate movement and a size for assembly may be applied In this way, if the magnetization intensity (intensity of magnetic force) for each process step can be adjusted, it may be useful to increase the successful assembly rate.

The above description is merely illustrative of the technical spirit of the present disclosure. It will be apparent to those skilled in the art that various modifications and variations can be made in the present disclosure without departing from the spirit and scope of the disclosure.

Therefore, the embodiments disclosed in the present disclosure are merely illustrative of the technical spirit of the present disclosure. The scope of the technical spirit of the present disclosure is not limited by these embodiments.

The scope of the present disclosure should be construed by the appended claims, and all technical ideas within the scope equivalent thereto should be construed as being within the scope of the present disclosure.

INDUSTRIAL APPLICABILITY

The present disclosure may provide a light emitting device using a semiconductor light emitting element having a size in micrometer (μm) unit, apparatus for manufacturing the same, and method for manufacturing the same.

What is claimed is:

1. An apparatus for manufacturing a display device, the apparatus comprising:
    a plate to support a substrate including an individual pixel position;
    a supplier to supply a multitude of light emitting elements including magnetic bodies to a first side of the substrate, respectively; and
    a magnetic chuck configured to be movable in X, Y and Z directions perpendicular to each other on a second side of the substrate and to assemble a light emitting element among the multitude of light emitting elements at the individual pixel position of the substrate using an electromagnet of the magnetic chuck,
    wherein the magnetic chuck comprises a power supplier to supply a power to the electromagnet of the magnetic chuck, and
    wherein the power supplier is configured to:
    supply a first current to the electromagnet of the magnetic chuck to move the light emitting element to the individual pixel position;
    supply a second current to the electromagnet of the magnetic chuck to assemble the light emitting element to the individual pixel position; and
    supply a third current to the electromagnet of the magnetic chuck to recover a remaining light emitting element from among the multitude of light emitting elements.

2. The apparatus of claim 1, wherein the magnetic chuck further comprises:
    a metal tip of a cylindrical rod configuration;
    a coil coupled to the metal tip; and
    a rotating mechanism rotating the metal tip.

3. The apparatus of claim 2, wherein the rotating mechanism rotates the metal tip within a predetermined radius about the magnetic chuck.

4. The apparatus of claim 2, wherein the magnetic chuck comprises a multitude of metal tips and coils provided with a predetermined spacing.

5. The apparatus of claim 1, wherein the magnetic chuck comprises a head having a multitude of metal tips.

6. The apparatus of claim 1, wherein the supplier includes a tray configured to move in a direction with respect to the substrate and to supply the multitude of light emitting elements.

7. The apparatus of claim 1, wherein a size of the first current is greater than a size of the second current, and wherein a size of the third current has a level between the size of the first current and the size of the second current.

8. The apparatus of claim 2, wherein among the coil and the metal tip, the metal tip is located closer to the substrate than the coil.

9. An apparatus for manufacturing a display device, the apparatus comprising:
    a support plate to support a substrate;
    a supplier to supply a plurality of light emitting elements to a first side of the substrate; and
    a magnetic chuck located on a second side of the substrate and configured to assemble a light emitting element from among the plurality of light emitting elements to an individual pixel position on the second side of the substrate using an electromagnet of the magnetic chuck,
    wherein the magnetic chuck comprises a power supplier to supply a power to the electromagnet of the magnetic chuck, and
    wherein the power supplier is configured to:
    supply a first current to the electromagnet of the magnetic chuck to move the light emitting element to the individual pixel position;
    supply a second current to the electromagnet of the magnetic chuck to assemble the light emitting element to the individual pixel position; and
    supply a third current to the electromagnet of the magnetic chuck to recover a remaining light emitting element from among the plurality of light emitting elements.

10. A method of manufacturing a display device that uses a plurality of light emitting elements, the method comprising:
    utilizing the apparatus of claim 9 to locate the plurality of light emitting elements on the substrate by processes of:
    supplying the first current to the electromagnet of the magnetic chuck to move the plurality of light emitting elements to individual pixel positions including the individual position;
    supplying the second current to the electromagnet of the magnetic chuck to assemble the plurality of light emitting elements to the individual pixel positions; and
    supplying the third current to the electromagnet of the magnetic chuck to recover the remaining light emitting element from among the plurality of light emitting elements that are not assembled to the individual pixel positions.

* * * * *